(12) United States Patent
Kim et al.

(10) Patent No.: US 8,320,194 B2
(45) Date of Patent: Nov. 27, 2012

(54) SEMICONDUCTOR MEMORY DEVICE FOR INCREASING TEST EFFICIENCY BY REDUCING THE NUMBER OF DATA PINS USED FOR A TEST

(75) Inventors: Jae-Il Kim, Gyeonggi-do (KR); Chang-Ho Do, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 1007 days.

(21) Appl. No.: 12/344,091

(22) Filed: Dec. 24, 2008

(65) Prior Publication Data

US 2010/0110811 A1    May 6, 2010

(30) Foreign Application Priority Data

Nov. 5, 2008  (KR) .................. 10-2008-0109276

(51) Int. Cl.
*G11C 7/10* (2006.01)
(52) U.S. Cl. ............... 365/189.05; 365/189.16; 365/201
(58) Field of Classification Search ............ 365/189.05, 365/189.07, 189.08, 189.16, 201
See application file for complete search history.

(56) References Cited

U.S. PATENT DOCUMENTS

| | | | |
|---|---|---|---|
| 2009/0067258 A1* | 3/2009 | Park | 365/189.02 |
| 2009/0154271 A1* | 6/2009 | Kwean | 365/201 |
| 2010/0054046 A1* | 3/2010 | Park | 365/189.05 |

FOREIGN PATENT DOCUMENTS

| | | |
|---|---|---|
| KR | 1020020002601 A | 1/2002 |
| KR | 1020070035934 | 4/2007 |

OTHER PUBLICATIONS

Notice of Allowance issued from Korean Intellectual Property Office on Sep. 27, 2010.
Notice of Preliminary Rejection issued from Korean Intellectual Property Office on Mar. 31, 2010.

\* cited by examiner

*Primary Examiner* — Alexander Sofocleous
*Assistant Examiner* — Hien Nguyen
(74) *Attorney, Agent, or Firm* — IP & T Group LLP

(57) ABSTRACT

A semiconductor memory device includes a first data input circuit configured to align data inputted to a first data pad in parallel for transferring the aligned data to a first global bus and for transferring the aligned data to a second global bus in a test mode; and a second data input circuit configured to align data inputted to a second data pad in parallel for transferring the aligned data to the second global bus and to not receive data in the test mode.

14 Claims, 9 Drawing Sheets

FIG. 3
(PRIOR ART)
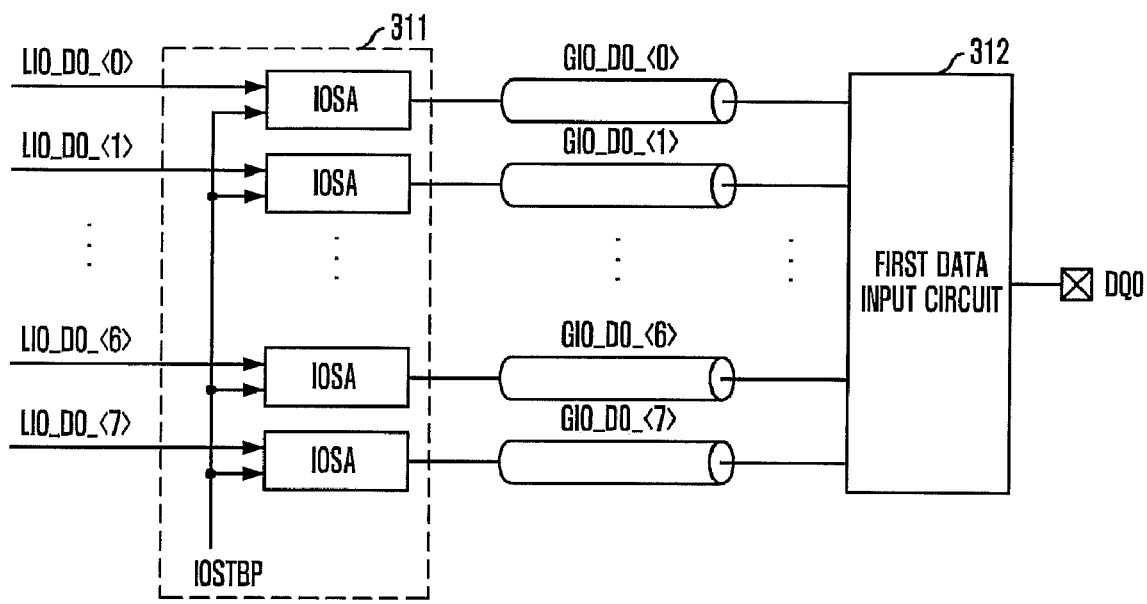
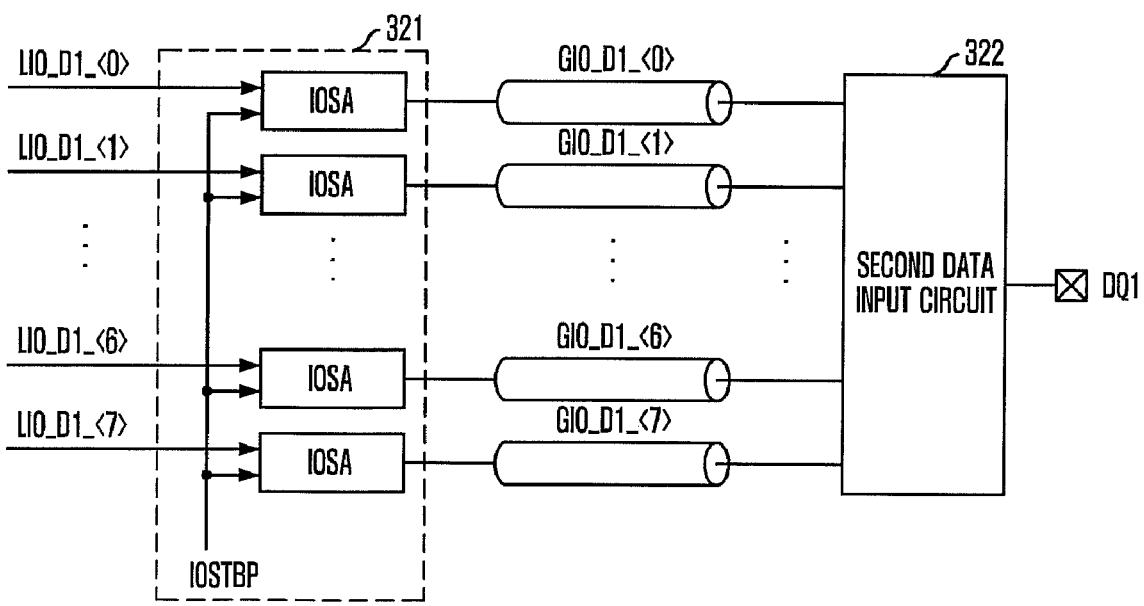

SEMICONDUCTOR MEMORY DEVICE FOR INCREASING TEST EFFICIENCY BY REDUCING THE NUMBER OF DATA PINS USED FOR A TEST

CROSS-REFERENCE TO RELATED APPLICATION

The present invention claims priority to Korean patent application number 10-2008-0109276, filed on Nov. 5, 2008, which is incorporated by reference in its entirety.

BACKGROUND OF THE INVENTION

The present invention relates to a semiconductor memory device, and more particularly, to a technology for increasing test efficiency by reducing the number of data pins needed for a test.

The present invention relates to a technology for reducing the number of data pins needed for a test of the semiconductor memory device; firstly, it will be described how data are transferred at a write time and a read time in a conventional semiconductor memory device.

FIG. 1 is a diagram illustrating a write path of a conventional semiconductor memory device.

In the drawing, the write path of data inputted to two data pads DQ0 and DQ1 is shown. Hereafter, a path of data inputted to the data pad DQ0 is referred to as a 'first path' and a path of data inputted to the data pad DQ1 is referred to as a 'second path' for purposes of clarity.

Data is sequentially inputted to the data pads DQ0 and DQ1 in series according to a Burst Length (BL). For instance, if the BL is 8, the data includes eight numbers that are sequentially inputted to the data pads DQ0 and DQ1 in series.

A first data input circuit 111 arrays data received through the data pad DQ0 in parallel and transfers the arrayed data to a first global bus GIO_D0_<0> to GIO_D0_<7>. A second data input circuit 121 arrays data received through the data pad DQ1 in parallel and transfers the arrayed data to a second global bus GIO_D1_<0> to GIO_D1_<7>.

Since the data includes eight numbers that are outputted from the first data input circuit 111 and the second data input circuit 121, each of the first global bus GIO_D0_<0> to GIO_D0_<7> and the second global bus GIO_D1_<0> to GIO_D1_<7> is configured with eight lines. As is well-known, the global buses GIO_D0_<0> to GIO_D0_<7> and GIO_D1_<0> to GIO_D1_<7> transfer data to all the banks (in FIG. 1, the data is illustrated as being transferred to a single bank).

Write driver units 112 and 122 are configured to transfer data, which is transferred to the global buses GIO_D0_<0> to GIO_D0_<7> and GIO_D1_<0> to GIO_D1_<7>, to local buses LIO_D0_<0> to LIO_D0_<7> and LIO_D1_<0> to LIO_D1_<7> in the bank. The first write driver unit 112 transfers data transferred to the first global bus GIO_D0_<0> to GIO_D0_<7> to the first local bus LIO_D0_<0> to LIO_D0_<7> in the bank. The second write driver unit 122 transfers data transferred to the second global bus GIO_D1_<0> to GIO_D1_<7> to the second local bus LIO_D1_<0> to LIO_D1_<7> in the bank.

Although local lines which connect the local buses LIO_D0_<0> to LIO_D0_<7> and LIO_D1_<0> to LIO_D1_<7> are normally configured as a pair of a main line and a sub line, i.e., LIO/LIOB, for transferring data, this is illustrated by only one line in the drawing.

FIG. 2 is a diagram showing a configuration of the first data input circuit 111. Since the second data input circuit 121 has the same configuration as the first data input circuit 111, the configuration of the second data input circuit 121 also can be understood with reference to FIG. 2.

The first input circuit 111 includes a buffer unit 210, an alignment unit 220 and a driver unit 230.

The buffer unit 210 buffers a data DATA_IN inputted in series from the first data pad DQ0. The alignment unit 220 aligns the buffered data in parallel and outputs the aligned data. In the example where the BL is 8, since eight numbers of data are sequentially inputted in series, the alignment unit 220 outputs eight numbers of data in parallel. The driver unit 230 is strobed by a strobe signal DINSTBP for determining a timing when a data is loaded on the first global bus GIO_D0_<0> to GIO_D0_<7>, and loads eight numbers of data on the first global bus GIO_D0_<0> to GIO_D0_<7> concurrently.

FIG. 3 is a diagram illustrating a read path of the conventional semiconductor memory device.

In the drawing, the read path of data outputted to two data pads DQ0 and DQ1 is shown. Also, in the same manner as the write path, a path of data outputted to the data pad DQ0 is referred to as a 'first path' and a path of data outputted to the data pad DQ1 is referred to as a 'second path' for purposes of clarity.

If a read command is applied to the memory device, data is outputted from the bank through the local buses LIO_D0_<0> to LIO_D0_<7> and LIO_D1_<0> to LIO_D1_<7>. The data transferred through the first local bus LIO_D0_<0> to LIO_D0_<7> is loaded on the first global bus GIO_D0_<0> to GIO_D0_<7> by a first sense amplifier unit 311 and the data transferred through the second local bus LIO_D1_<0> to LIO_D1_<7> is loaded on the second global bus GIO_D1_<0> to GIO_D1_<7> by a second sense amplifier unit 321. As shown in FIG. 3, each of the sense amplifier units 311 and 321 is configured with eight numbers of a sense amplifier IOSA. The sense amplifier IOSA is strobed by a strobe signal IOSTBP for determining a timing of when data is loaded on the global buses GIO_D0_<0> to GIO_D0_<7> and GIO_D1_<0> to GIO_D1_<7>. The sense amplifier IOSA also loads data from the local buses LIO_D0_<0> to LIO_D0_<7> and LIO_D1_<0> to LIO_D1_<7> on the global buses GIO_D0_<0> to GIO_D0_<7> and GIO_D1_<0> to GIO_D1_<7>.

A first data output circuit 312 aligns eight numbers of data transferred from the first global bus GIO_D0_<0> to GIO_D0_<7> in series and outputs the aligned data to the outside of the memory device through the first data pad DQ0. Also, the second data output circuit 322 aligns eight numbers of data transferred from the second global bus GIO_D1_<0> to GIO_D1_<7> in series and outputs the aligned data to the outside of the memory device through the second data pad DQ1.

FIG. 4 is a diagram illustrating a configuration of the first data output circuit 312. Since the second data output circuit 322 has the same configuration as the first data output circuit 312, a configuration of the second data output circuit 322 also can be understood with reference to FIG. 4.

The first data output circuit 312 includes a pipe latch 410 and an output driver 420. The pipe latch 410 aligns data transferred through the first global bus GIO_D0_<0> to GIO_D0_<7> in series and outputs the aligned data. In an example in which the BL is 8, since eight numbers of data should be sequentially outputted in series, the pipe latch 410 aligns eight numbers of data, which have been transferred in parallel, in series and outputs the aligned data. The output driver 420 outputs the data, which have been aligned in series, to the outside of the memory device through the first data pad DQ0.

Until now, manners in which data is read/written through the two data pads DQ0 and DQ1 have been described. However, in an x16 memory device, data is read/written through sixteen data pads DQ0 to DQ15; and, in an x32 memory device, data is read/written through thirty two data pads DQ0 to DQ31.

When the memory device is tested, the test is performed by assigning a channel to a data pad from test equipment. If an x16 memory device is tested, sixteen data channels are typically assigned to each memory device. The number of channels of the test equipment is, however, limited. Accordingly, if the number of channels needed for the test can be reduced, more memory devices can be tested with one test equipment. Therefore, if the number of data channels needed for the test, i.e., the number of data pads, can be reduced, the amount of time required to test the memory device may be reduced, and the costs associated with performing the test may also be reduced.

SUMMARY OF THE INVENTION

Embodiments of the present invention are directed to reducing the costs associated with testing a memory device by making it possible to test more memory devices with one test equipment by reducing the number of data pads needed for the test of the memory device.

In accordance with an aspect of the present invention, there is provided a semiconductor memory device, which includes a first data input circuit configured to align data inputted to a first data pad in parallel for transferring the aligned data to a first global bus and for transferring the aligned data to a second global bus in a test mode; and a second data input circuit configured to align data inputted to a second data pad in parallel for transferring the aligned data to the second global bus and to not receive data in the test mode.

In accordance with another aspect of the present invention, there is provided a semiconductor memory device, which includes a first sense amplifier unit configured to load data of a first local bus on a first global bus, and in a test mode, load the data of the first local bus and data of a second local bus on the first global bus in turn; a second sense amplifier unit configured to load the data of the second local bus on a second global bus; a first data output circuit configured to align the data transferred from the first global bus in series and output the aligned data to a first data pad; and a second data output circuit configured to align the data transferred from the second global bus in series and output the aligned data to a second data pad.

In accordance with still another aspect of the present invention, there is provided a semiconductor memory device, which includes a first data input circuit configured to align data inputted to a first data pad in parallel for transferring the aligned data to a first global bus and transferring the aligned data to a second global bus in a test mode; a second data input circuit configured to align data inputted to a second data pad in parallel for transferring the aligned data to the second global bus and to not receive data in the test mode; a first write driver unit configured to load the data transferred from the first global bus on a first local bus; a second write driver unit configured to load the data transferred from the second global bus on a second local bus; a first sense amplifier unit configured to load the data of the first local bus on the first global bus and load the data of the first local bus and the data of the second local bus on the first global bus in turn during the test mode; a second sense amplifier unit configured to load the data of the second local bus on the second global bus; a first data output circuit configured to align the data transferred from the first global bus in series for outputting the aligned data to the first data pad; and a second data output circuit configured to align the data transferred from the second global bus in series for outputting the aligned data to the second data pad.

BRIEF DESCRIPTION OF THE DRAWINGS

FIG. 3 is a diagram illustrating a read path of the conventional semiconductor memory device.

DESCRIPTION OF SPECIFIC EMBODIMENTS

In order to describe in detail such that those skilled in the art may easily implement the spirit and scope of the present invention, the embodiments of the present invention will be described with reference to the accompanying drawings.

Figure 5:
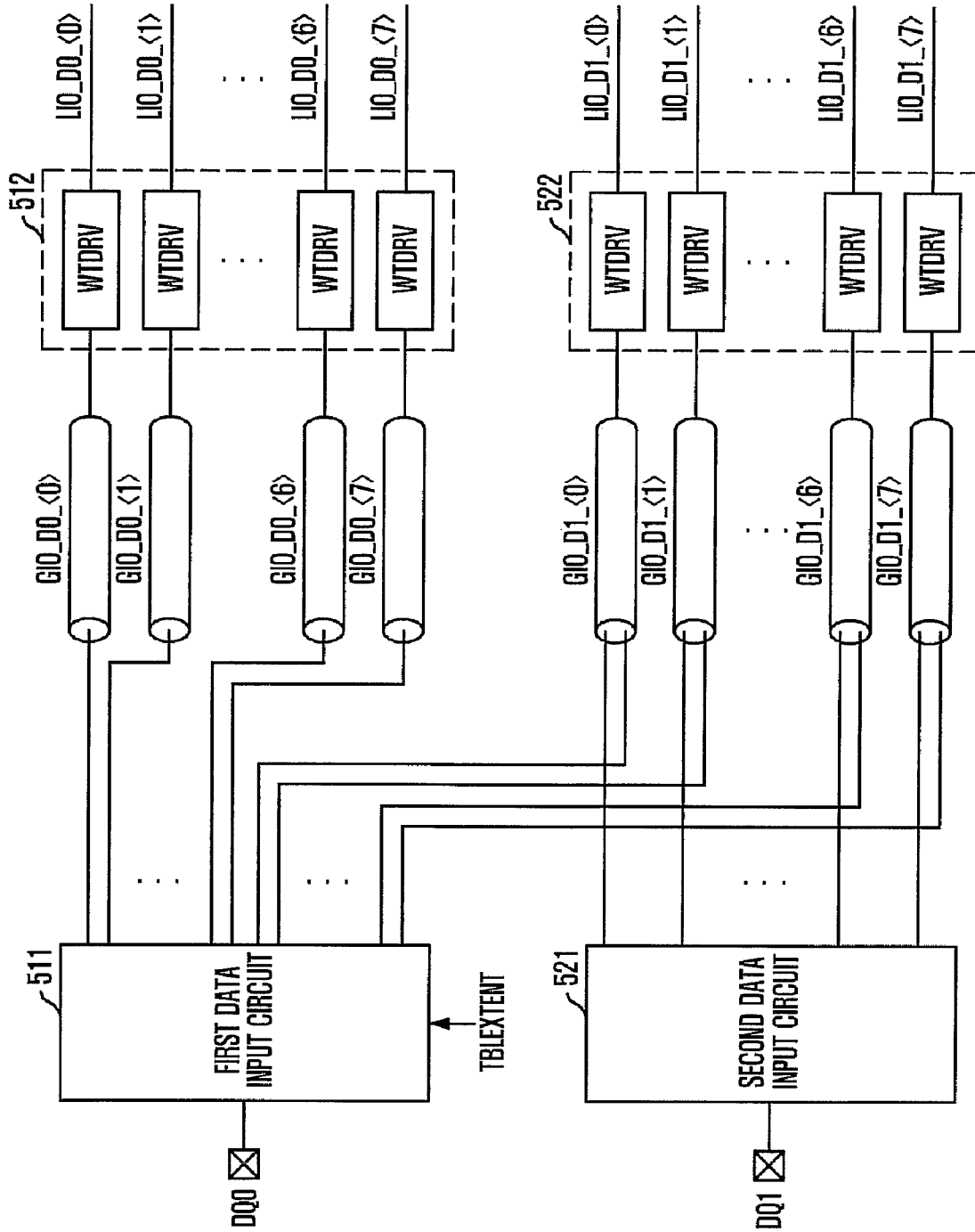
FIG. 5 is a diagram illustrating a write path of a semiconductor memory device in accordance with an embodiment of the present invention.

FIG. 5 is a diagram illustrating a write path of a semiconductor memory device in accordance with an embodiment of the present invention.

The semiconductor memory device in accordance with the present invention includes a first data input circuit 511 for aligning data inputted to a first data pad DQ0 in parallel to transfer the aligned data to a first global bus GIO_D0_<0> to GIO_D0_<7>, and for transferring the aligned data to a second global bus GIO_D1_<0> to GIO_D1_<7> also in a test mode, and a second data input circuit 521 for aligning data inputted to a second data pad DQ1 in parallel to transfer the aligned data to the second global bus GIO_D1_<0> to GIO_D1_<7>, and for not receiving data in the test mode.

Figure 1:
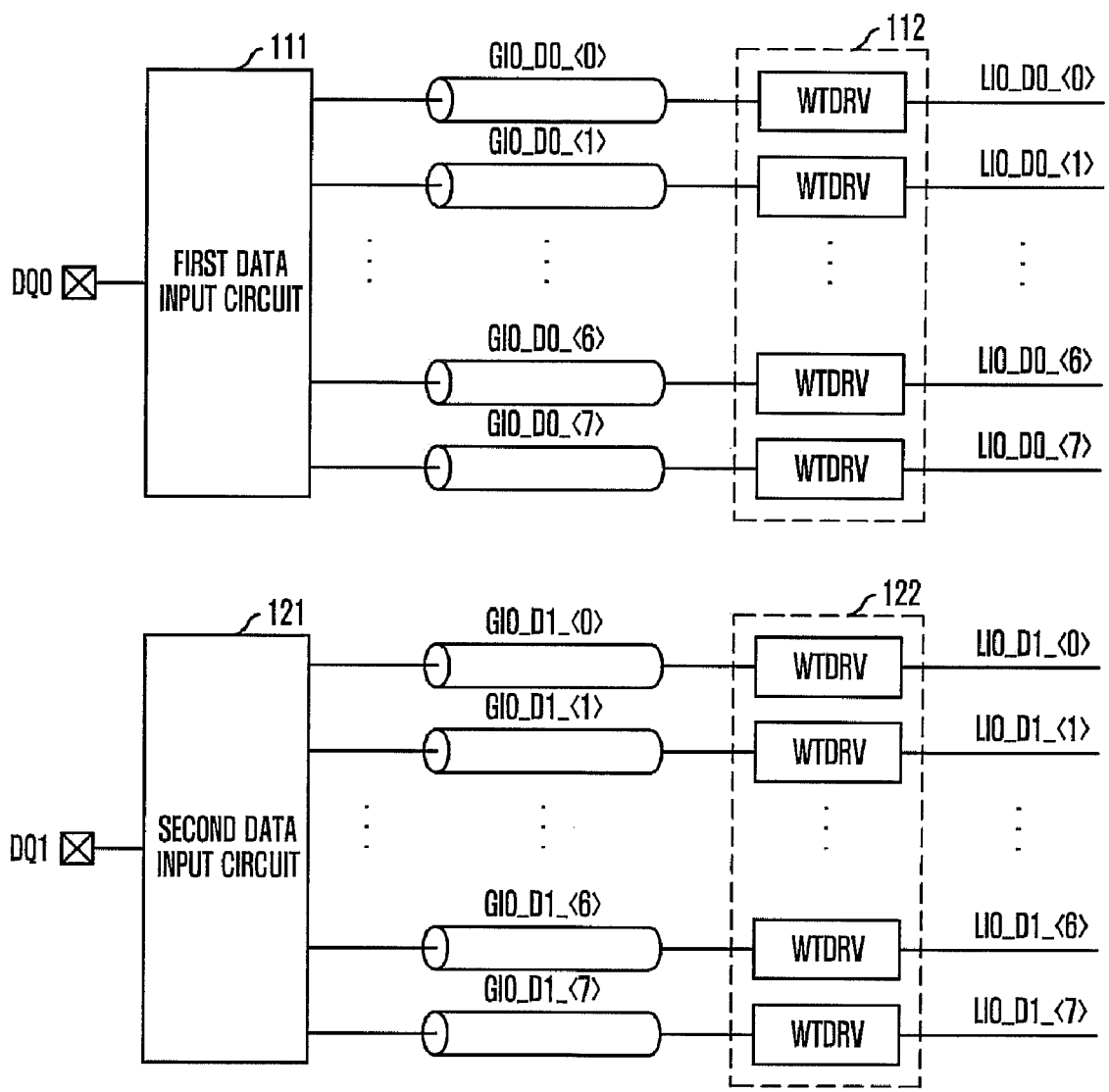
FIG. 1 is a diagram illustrating a write path of the conventional semiconductor memory device.

The first data input circuit 511 and the second data input circuit 521 of the present invention are operated in the same manner as the conventional first data input circuit 111 shown in FIG. 1 and the second data input circuit 121 shown in FIG. 1 under normal operating conditions. Under normal operating conditions, the data inputted to the first data input circuit 511 are transferred to a first write driver unit 512 through the first global bus GIO_D0_<0> to GIO_D0_<7>, and the first write driver unit 512 transfers the data of the first global bus GIO_D0_<0> to GIO_D0_<7> to a first local bus LIO_D0_<0> to LIO_D0_<7> in a bank. Likewise, the data inputted to the second data input circuit 521 are transferred to a second write driver unit 522 through the second global bus GIO_D1_<0> to GIO_D1_<7>, and the second write driver unit 522 transfers the data of the second global bus GIO_D1_<0> to GIO_D1_<7> to a second local bus LIO_D0_<0> to LIO_D0_<7> in the bank.

However, the first data input circuit 511 and the second data input circuit 521 of the present invention are differently operated in the test mode in comparison with the related art. In the test mode, the second data pad DQ1 is not connected to test equipment. Accordingly, the data cannot be inputted to the second data input circuit 521. Therefore, the second data input circuit 521 does not transfer the data to the second global bus GIO_D1_<0> to GIO_D1_<7>.

In the test mode, the first data input circuit 511 transfers the data, which are inputted to the first data input circuit 511 and are aligned by the first data input circuit 511, to the first global bus GIO_D0_<0> to GIO_D0_<7> and the second global bus GIO_D1_<0> to GIO_D1_<7>. That is, the second data input circuit 521 cannot transfer the data to the second global bus GIO_D1_<0> to GIO_D1_<7>; instead, the first data input circuit 511 transfers the data, which was inputted to the first data input circuit 511, to the second global bus GIO_D1_<0> to GIO_D1_<7> also.

The first data input circuit 511 can directly transfer the data aligned by it to the second global bus GIO_D1_<0> to GIO_D1_<7>, but also can transfer the aligned data to the second global bus GIO_D1_<0> to GIO_D1_<7> after inverting the aligned data. When the inverted data is transferred to the second global bus GIO_D1_<0> to GIO_D1_<7>, since different data are transferred to the first global bus GIO_D0_<0> to GIO_D0_<7> and the second global bus GIO_D1_<0> to GIO_D1_<7>, the test can be more efficiently performed. A description as to why it is possible to perform the test more efficiently is presented herein below.

The first write driver unit 512 is configured to transfer the data transferred to the first global bus GIO_D0_<0> to GIO_D0_<7> to the first local bus LIO_D0_<0> to LIO_D0_<7>, and the second write driver unit 522 is configured to transfer the data transferred to the second global bus GIO_D1_<0> to GIO_D1_<7> to the second local bus LIO_D1_<0> to LIO_D1_<7>, i.e., they are not differently operated even in the test mode in comparison with the normal operating conditions. That is, the conventional first write driver unit 112 shown in FIG. 1 and the second write driver unit 122 shown in FIG. 2 can be directly used for the present invention.

The present invention transfers the data to the first global bus GIO_D0_<0> to GIO_D0_<7> and the second global bus GIO_D1_<0> to GIO_D1_<7> by using only the first data input circuit 511 in the test mode. Accordingly, the data pad DQ1, which corresponds to the second data input circuit 521, is not needed to be connected to the test equipment. That is, the number of data channels needed for the test can be reduced by half. For instance, sixteen data channels should be assigned for testing the x16 memory device according to the related art; however, the test can be performed with just eight data channels, which correspond to the first data input circuit 511, since eight numbers of first data input circuit 511 and eight numbers of second data input circuit 521 are included under the present invention.

A test signal TBLEXTENT shown in the drawing is a signal which is deactivated as a low level in the normal operating condition and is activated as a high level in the test mode.

Figure 6:
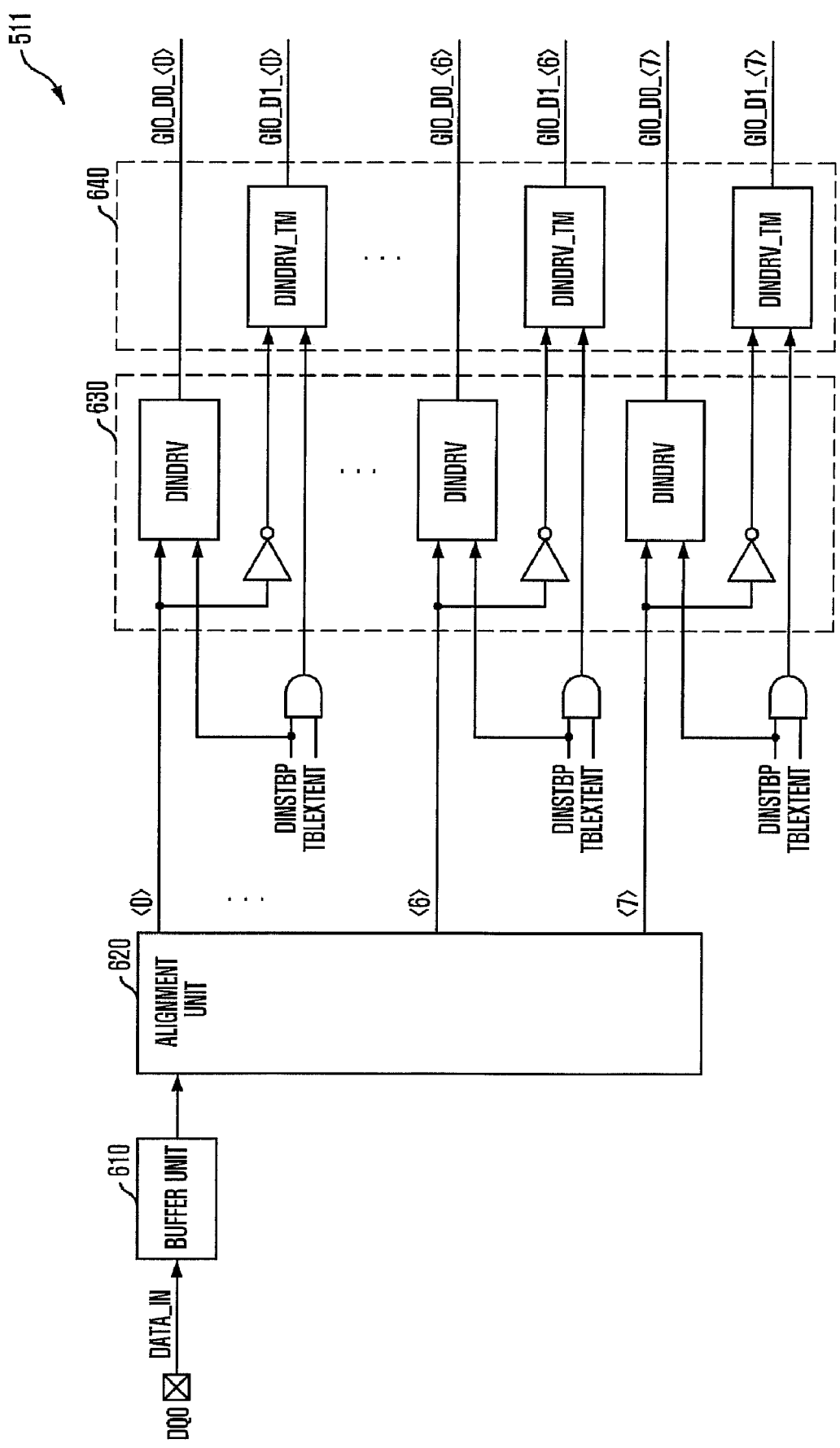
FIG. 6 is a configuration diagram illustrating an embodiment of a first data input circuit shown in FIG. 5.

FIG. 6 is a configuration diagram illustrating an embodiment of the first data input circuit 511 shown in FIG. 5.

The first data input circuit 511 includes a buffer unit 610 for buffering a data DATA_IN inputted to the first data pad DQ0; an alignment unit 620 for aligning the buffered data in parallel; a normal driver unit 630 for transferring the data aligned in parallel to the first global bus GIO_D0_<0> to GIO_D0_<7>; and a test driver unit 640 enabled in the test mode for transferring the data aligned in parallel to the second global bus GIO_D1_<0> to GIO_D1_<7>.

Figure 2:
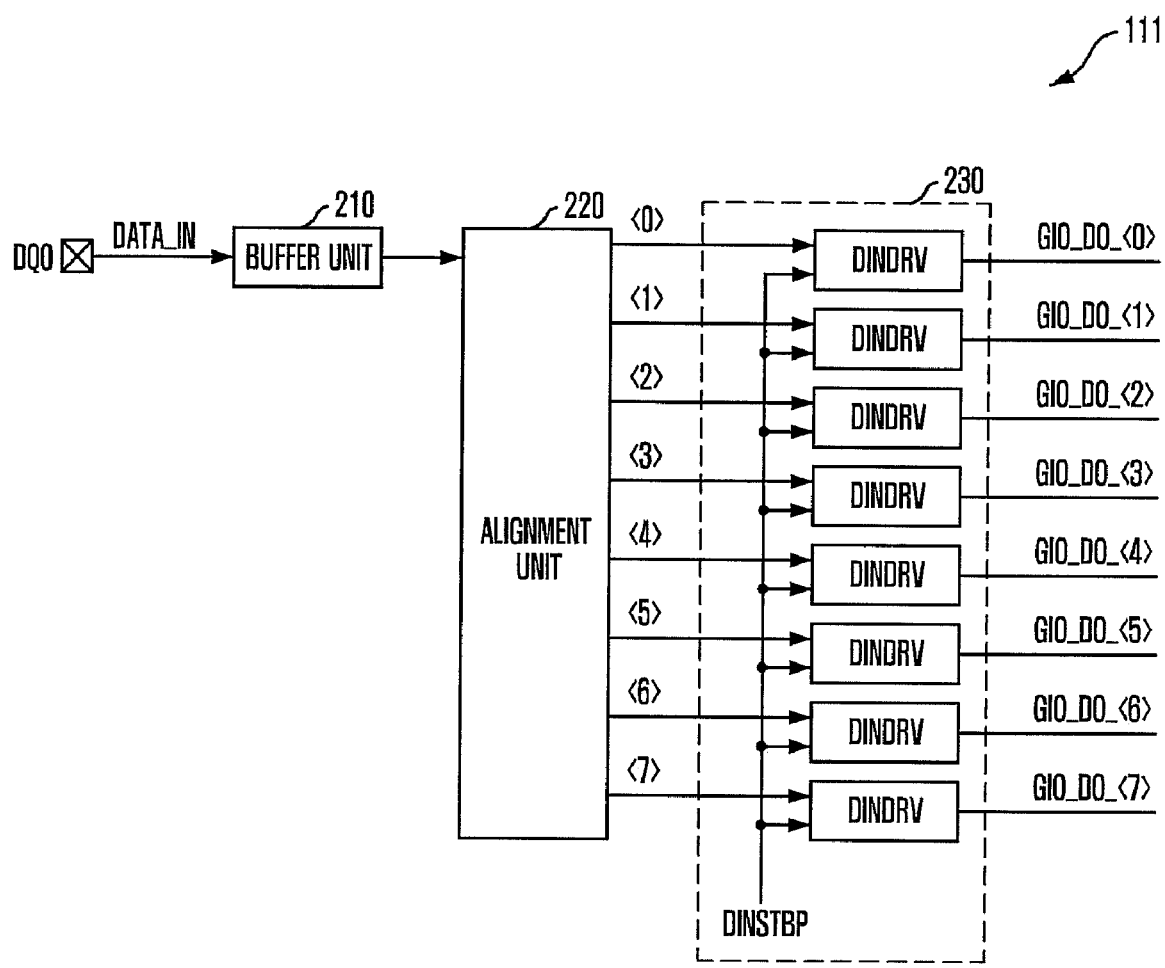
FIG. 2 is a diagram showing a configuration of a first data input circuit 111.
Figure 4:
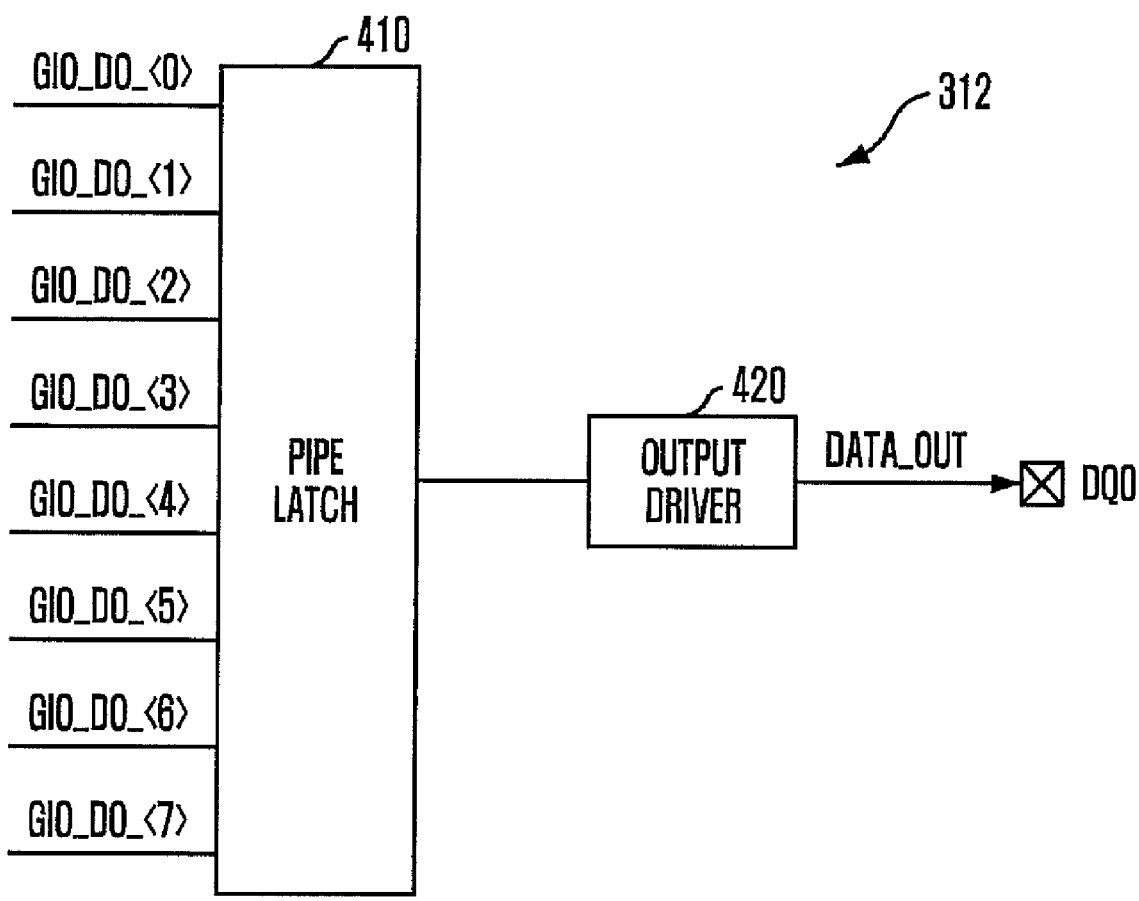
FIG. 4 is a diagram illustrating a configuration of a first data output circuit 312.

The buffer unit 610, the alignment unit 620 and the normal driver unit 630 respectively correspond to the conventional buffer unit 210, alignment unit 220 and driver unit 230 shown in FIG. 2 and can be configured in the same manner.

However, the first data input circuit 511 of the present invention includes the test driver unit 640, which is not included in the related art. The test driver unit 640 is disabled under normal operating conditions and is enabled in the test mode to transfer the data inputted through the first data input circuit 511 to the second global bus GIO_D1_<0> to GIO_D1_<7>. The test driver unit 640 can directly transfer the data inputted through the first data input circuit 511 to the second global bus GIO_D1_<0> to GIO_D1_<7>, but also can transfer the data to the second global bus GIO_D1_<0> to GIO_D1_<7> after converting the data. In this case, since converted data can be outputted instead of sequentially outputting the same data in a read operation of data, a more efficient test can be performed. An inverter of the input of the test driver unit 640 is an inverter for inverting data.

The test driver unit 640 does not directly receive a strobe signal DINSTBP but receives the signal through a logic AND gate after performing a logic AND operation to the strobe signal DINSTBP and the test mode signal TBLEXTENT. While the test mode signal TBLEXTENT is kept as a low level, since the strobe signal DINSTBP inputted to the test driver unit 640 is always kept as a low level, the test driver unit 640 cannot be operated. On the contrary, while the test mode signal TBLEXTENT is kept as a high level, the test driver unit 640 is strobed in a similar manner as the normal driver unit 630 is strobed and is normally operated.

Figure 7:
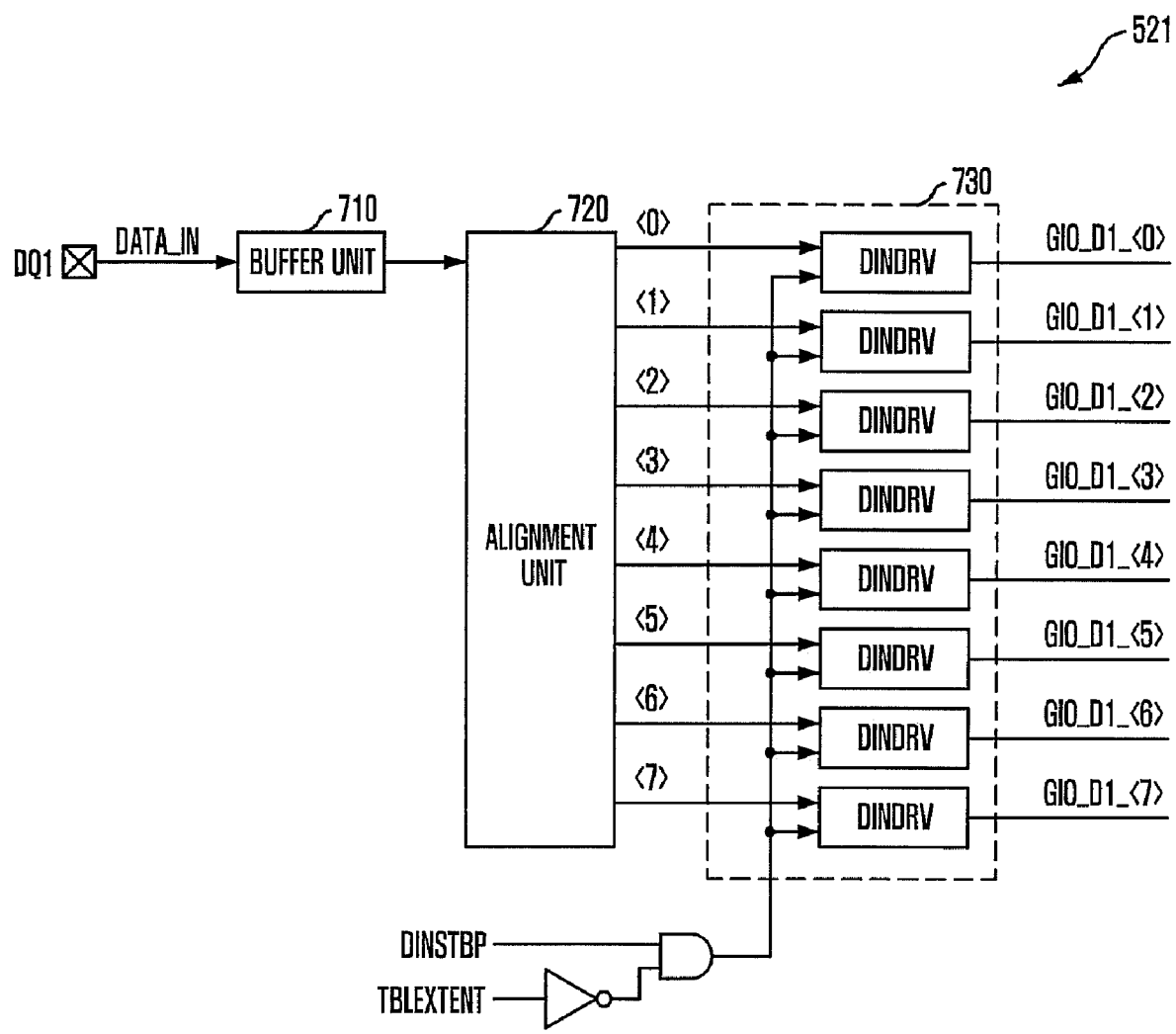
FIG. 7 is a configuration diagram illustrating an embodiment of a second data input circuit shown in FIG. 5.

FIG. 7 is a configuration diagram illustrating an embodiment of the second data input circuit 521 shown in FIG. 5.

The second data input circuit 521 includes a buffer unit 710 for buffering a data DATA_IN inputted to the second data pad DQ1; an alignment unit 720 for aligning the buffered data in parallel; and a driver unit 730 for transferring the data aligned in parallel to the second global bus GIO_D1_<0> to GIO_D1_<7> and for not transferring the data in the test mode.

The buffer unit 710 and the alignment unit 720 are configured in a similar manner as the buffer unit 510 and the alignment unit 520 of the first data input circuit 511 are configured.

However, the driver unit 730 of the second data input circuit 521 is operated only in the normal operation and is not operated in the test mode. That is, in the test mode, since the second data pad DQ1 which corresponds to the second data input circuit 521 is not connected to the test equipment, the data are not inputted and the first data input circuit 511 transfers the data to the second global bus GIO_D1_<0> to GIO_D1_<7> instead of the second data input circuit 521 and thus the second data input circuit 521 need not be operated.

The driver unit 730 does not directly receive the strobe signal DINSTBP but receives the signal through a logic AND gate after performing a logic AND operation to an inverted signal of the test mode signal TBLEXTENT and the strobe signal DINSTBP. Accordingly, while the test mode signal TBLEXTENT is a low level, the strobe signal DINSTBP is directly transferred to the driver unit 730 so that the driver unit 730 is normally operated; however, while the test mode signal TBLEXTENT is a high level, the driver unit 730 is not operated.

Figure 8:
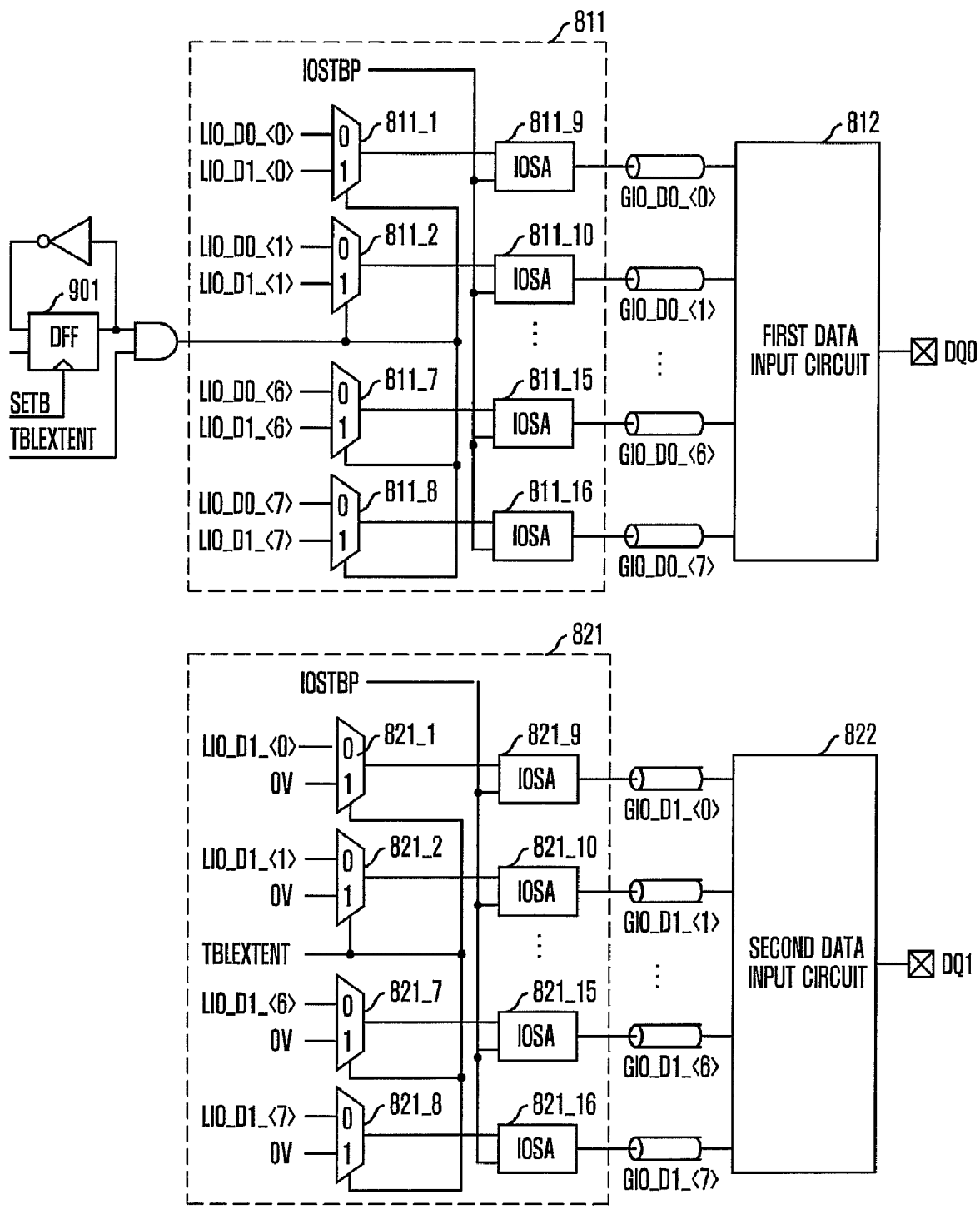
FIG. 8 is a diagram illustrating a read path of the semiconductor memory device in accordance with an embodiment of the present invention.

FIG. 8 is a diagram illustrating a read path of the semiconductor memory device in accordance with an embodiment of the present invention.

The semiconductor memory device in accordance with the present invention includes a first sense amplifier unit 811 for loading the data of the first local bus LIO_D0_<0> to LIO_D0_<7> on the first global bus GIO_D0_<0> to GIO_D0_<7> and, in the test mode, for loading the data of the first local bus LIO_D0_<0> to LIO_D0_<7> and the data of the second local bus LIO_D1_<0> to LIO_D1_<7> on the first global bus GIO_D0_<0> to GIO_D0_<7> in turn; a second sense amplifier unit 821 for loading the data of the second local bus LIO_D1_<0> to LIO_D1_<7> on the second global bus GIO_D1_<0> to GIO_D1_<7>; a first data output circuit 812 for aligning the data transferred from the first global bus GIO_D0_<0> to GIO_D0_<7> in series and for outputting the aligned data to the first data pad DQ0; and a second data output circuit 822 for aligning the data transferred from the second global bus GIO_D1_<0> to GIO_D1_<7> in series and for outputting the aligned data to the second data pad DQ1.

The semiconductor memory device shown in FIG. 8 performs the read operation in a similar manner as the conventional semiconductor memory device does under normal operating conditions. However, in the test mode, since the second data pad DQ1 is not connected to the test equipment, the semiconductor memory device is operated in a different manner in comparison with the related art.

The sense amplifier unit 811 loads only the data of the first local bus LIO_D0_<0> to LIO_D0_<7> to the first global bus GIO_D0_<0> to GIO_D0_<7> under normal operating conditions. However, in the test mode, the first sense amplifier unit 811 alternately loads the data of the first local bus LIO_D0_<0> to LIO_D0_<7> and the data of the second local bus LIO_D1_<0> to LIO_D1_<7> on the first global bus GIO_D0_<0> to GIO_D0_<7>. This is because, in the test mode, since the second data pad DQ1 is not connected to the test equipment, the data of the first local bus LIO_D0_<0> to LIO_D0_<7> and the data of the second local bus LIO_D1_<0> to LIO_D1_<7> should be outputted through the first data pad DQ0.

Multiplexers 811_1 to 811_8 are provided to inputs of sense amplifiers 811_9 to 811_16 of the first sense amplifier unit 811. The multiplexers 811_1 to 811_8 are controlled by a selection signal SELECT. In the normal mode, since the test mode signal TBLEXTENT has a low level, the selection signal SELECT has a low level. Accordingly, the multiplexers 811_1 to 811_8 transfer only the data of the first local bus LIO_D0_<0> to LIO_D0_<7> to the sense amplifiers 811_9 to 811_16.

In the test mode, the test mode signal TBLEXTENT has a high level. Accordingly, the selection signal SELECT is changed according to an output value of a D-flip-flop 801. Since the output value of the D-flip-flop 801 is changed every time that an internal read pulse IRDP_NEW is once activated, the selection signal SELECT has a value that is changed to a low level and a high level in the test mode. Therefore, the multiplexers 811_1 to 811_8 transfer the data of the first local bus LIO_D0_<0> to LIO_D0_<7> to the sense amplifiers 811_9 to 811_16 and then transfer the data of the second local bus LIO_D1_<0> to LIO_D1_<7> to the sense amplifier 811_9 to 811_16. A signal SETB inputted to the D-flip-flop 801 is a signal for setting an initial value of an output signal of the D-flip-flop 801 as a low level.

The internal read pulse IRDP_NEW is once activated every time that a read command is applied in the normal operation and is twice activated every time that the read command is applied in the test mode. Since a strobe signal IOSTBP is generated based on the internal read pulse IRDP_NEW, even if the read command is activated only once in the test mode, the strobe signal IOSTBP is twice activated. Accordingly, if one read command is applied in the test mode, the first sense amplifier unit 511 loads the data of the first local bus LIO_D0_<0> to LIO_D0_<7> on the first global bus GIO_D0_<0> to GIO_D0_<7> once and loads the data of the second local bus LIO_D1_<0> to LIO_D1_<7> on the first global bus GIO_D0_<0> to GIO_D0_<7> once. Various manners in which the internal read pulse IRDP_NEW is generated are described with reference to FIG. 9 below.

The second sense amplifier unit 821 is configured to load the data of the second local bus LIO_D1_<0> to LIO_D1_<7> on the second global bus GIO_D1_<0> to GIO_D1_<7> in the normal mode. The manner in which the second sense amplifier unit 821 is operated in the test mode is inconsequential. Rather, because the second data pad DQ1 is not connected to the test equipment in the test mode, an operation of the second amplifier unit 821 cannot have any effect on the operation of the semiconductor memory device as a whole. Accordingly, the direct use of the conventional second sense amplifier unit 321 shown in FIG. 3 as the second sense amplifier unit 821 is inconsequential.

In the drawing, multiplexers 821_1 to 821_8 are provided to inputs of sense amplifiers 821_9 to 821_16 of the second sense amplifier unit 821 to transfer the data of the second local bus LIO_D1_<0> to LIO_D1_<7> to the sense amplifiers 821_9 to 821_16 under normal operating conditions and to transfer a ground voltage (0V) to the sense amplifiers 821_9 to 821_16 in the test mode. This is not for performing some new operations, but for setting the loading of the second sense amplifier unit 821 to be the same as the first sense amplifier unit 811.

The first data output circuit 812 aligns the data transferred to the first global bus GIO_D0_<0> to GIO_D0_<7> in series and outputs the aligned data to the first data pad DQ0. In the normal mode, since only a single bit of data is transferred from the first global bus GIO_D0_<0> to GIO_D0_<7> every time that one read command is applied, the first data output circuit 812 sequentially outputs eight data in series. In the test mode, if one read command is applied, since the data of the first local bus LIO_D0_<0> to LIO_D0_<7> are delivered firstly through the first global bus GIO_D0_<0> to GIO_D0_<7>, the first data output circuit 812 aligns the data in series and then outputs eight data; and again, since the data of the second local bus LIO_D1_<0> to LIO_D1_<7> are delivered through the first global bus GIO_D0_<0> to GIO_D0_<7>, the first data output circuit 812 aligns the data and then outputs eight data.

That is, in the test mode, the first data output circuit 812 is operated in the same manner, not only in the case of applying one read command, but also in the case of applying the read command twice. From a different point of view, it can be said that the first data output circuit 812 is operated as if a Burst Length (BL) is doubled in the test mode in comparison with the normal operating condition. This operation is possible since two internal read pulses IRDP_NEW are internally generated even if only one read command is applied from the outside in the test mode in accordance with the present invention.

The second data output circuit 822 aligns the data delivered to the second global bus GIO_D1_<0> to GIO_D1_<7> in series and outputs the aligned data to the second data pad DQ1 under normal operating conditions. However, in the test mode, since the second data pad DQ1 is not connected to the test equipment, the second data output circuit 822 does not output the data. Accordingly, in the test mode, leaving the second data output circuit 822 in any state is inconsequential.

In the write operation of the test mode, the data inputted to the first local bus LIO_D0_<0> to LIO_D0_<7> and the data inputted to the second local bus LIO_D1_<0> to LIO_D1_<7> are inverted with each other (refer to the explanations of FIG. 5). And, in the read operation, the data of the first local bus LIO_D0_<0> to LIO_D0_<7> and the data of the second local bus LIO_D1_<0> to LIO_D1_<7> are transferred to the first data output circuit 812 in turn through the first global bus GIO_D0_<0> to GIO_D0_<7>. Accordingly, in the read operation, the data having an opposite phase with each other are continuously transferred to the first global bus GIO_D0_<0> to GIO_D0_<7>. This pattern of data can increase efficiency of the test by making it easier to decide a margin of a circuit or the like.

According to an embodiment, when configuring the semiconductor memory device as shown in FIG. 8, the number of data channels needed for the read operation may be reduced by half during the test.

Figure 9:
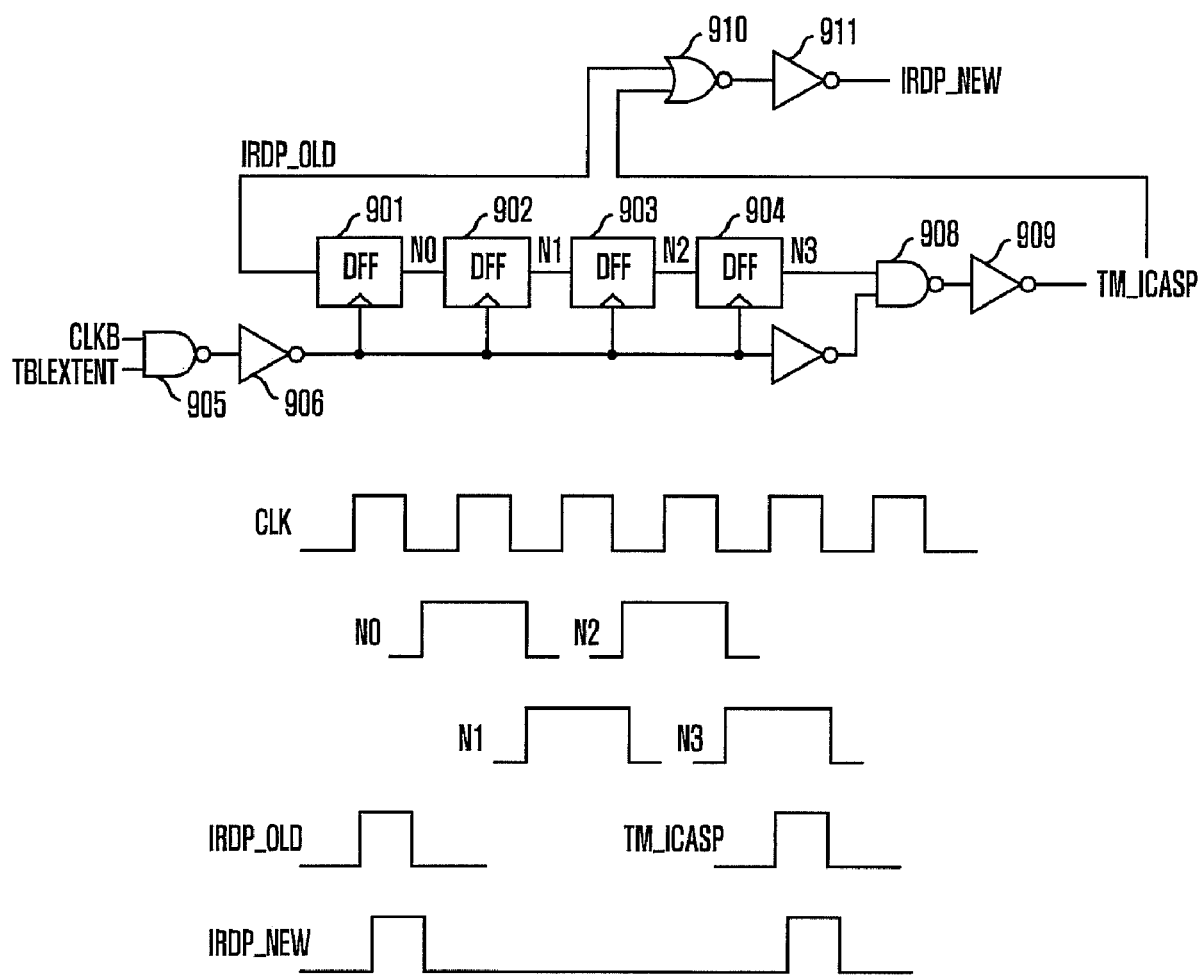
FIG. 9 is a diagram illustrating a circuit for generating the internal read pulse of the present invention and a timing graph of the circuit in accordance with an embodiment of the present invention.

FIG. 9 is a diagram illustrating a circuit for generating the internal read pulse of the present invention and a timing graph of the circuit.

As shown in the drawing, the internal read pulse generating circuit includes D-flip-flops 901 to 904 and logic gates 905 to 911.

A conventional internal read pulse IRDP_OLD is a pulse signal which is once activated every time that the read command is applied. Since the test mode signal TBLEXTENT has a low level under normal operating conditions, a clock inputted to the D-flip-flops 901 to 904 is not toggled and a signal TM_ICASP has only a low level. Accordingly, under normal operating conditions, the conventional internal read pulse IRDP_OLD and the internal read pulse IRDP_NEW of the present invention are the same (IRDP_OLD=IRDP_NEW).

In the test mode, the test mode signal TBLEXTENT is a high level, and the clock inputted to the D-flip-flops is toggled. Accordingly, the conventional internal read pulse IRDP_OLD is shifted by four clocks to become the signal TM_ICASP. Since the internal read pulse IRDP_NEW of the present invention is generated by performing a logic operation to the conventional internal read pulse IRDP_OLD and the signal TM_ICASP, the internal read pulse IRDP_NEW of the present invention is activated once when the conventional internal read pulse IRDP_OLD is activated and is activated once more after four clocks.

In the test mode, since the internal read pulse IRDP_NEW of the present invention is twice activated when the conventional internal read pulse IRDP_OLD is activated once, the read operation is internally performed twice. Even if the internal read pulse IRDP_NEW is sequentially activated twice, there should be a minimum time needed for one read operation between the activations. In the drawing, the minimum time for the read operation is exemplified as having four clocks.

The timing diagram is illustrated below the circuit diagram and shows an operation of the circuit in detail. Referring to this diagram, the operation of the circuit can be more clearly understood.

The semiconductor memory device in accordance with the present invention reduces the number of data pads needed for the test in half. Accordingly, the number of memory devices tested at one time may be increased and thus the cost of testing the memory devices may be greatly reduced.

Further, unlike the parallel test in which simply the number of data pads are decreased, even if the number of data pads is decreased in half, the operations performed internally in the memory device are the same as under normal operating conditions and thus more efficient testing is possible.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a first data input circuit configured to align data inputted to a first data pad in parallel for transferring the aligned data to a first global bus and for transferring the aligned data to a second global bus after inverting the aligned data in a test mode, wherein the data transferred to the second global bus during the test mode is inverse data of the data transferred to the first global bus; and
   a second data input circuit configured to align data inputted to a second data pad in parallel for transferring the aligned data to the second global bus and to not receive data in the test mode.

2. The semiconductor memory device of claim 1, wherein the first data input circuit includes:
   a buffer unit configured to buffer the data inputted to the first data pad;
   an alignment unit configured to align the buffered data in parallel;
   a normal driver unit configured to transfer the data aligned in parallel to the first global bus; and
   a test driver unit configured to be enabled in the test mode to transfer the data aligned in parallel to the second global bus after inverting the data aligned in parallel.

3. The semiconductor memory device of claim 2, further comprising a logic combination unit configured to supply a strobe signal to the test driver unit only if both a test mode signal activated in the test mode and a data input strobe signal are activated.

4. The semiconductor memory device of claim 1, wherein the second data input circuit includes:
   a buffer unit configured to buffer the data inputted to the second data pad;
   an alignment unit configured to align the buffered data in parallel; and
   a driver unit configured to transfer the data aligned in parallel to the second global bus and not to transfer the data aligned in parallel in the test mode.

5. A semiconductor memory device, comprising:
   a first sense amplifier unit configured to load data of a first local bus on a first global bus, and in a test mode, load the data of the first local bus and data of a second local bus on the first global bus in turn;
   a second sense amplifier unit configured to load the data of the second local bus on a second global bus;
   a first data output circuit configured to align the data transferred from the first global bus in series and output the aligned data to a first data pad; and
   a second data output circuit configured to align the data transferred from the second global bus in series and output the aligned data to a second data pad.

6. The semiconductor memory device of claim 5, wherein the second data pad is not connected to test equipment in the test mode.

7. The semiconductor memory device of claim 5, further comprising a pulse generating unit configured to generate an internal read pulse activated twice by applying one read command in the test mode.

8. The semiconductor memory device of claim 7, wherein the first sense amplifier unit alternately loads the data of the first local bus and the data of the second local bus on the first global bus every time that the internal read pulse is activated in the test mode.

9. A semiconductor memory device, comprising:
- a first data input circuit configured to align data inputted to a first data pad in parallel for transferring the aligned data to a first global bus and transferring the aligned data to a second global bus in a test mode;
- a second data input circuit configured to align data inputted to a second data pad in parallel for transferring the aligned data to the second global bus and to not receive data in the test mode;
- a first write driver unit configured to load the data transferred from the first global bus on a first local bus;
- a second write driver unit configured to load the data transferred from the second global bus on a second local bus;
- a first sense amplifier unit configured to load the data of the first local bus on the first global bus and load the data of the first local bus and the data of the second local bus on the first global bus in turn during the test mode;
- a second sense amplifier unit configured to load the data of the second local bus on the second global bus;
- a first data output circuit configured to align the data transferred from the first global bus in series for outputting the aligned data to the first data pad; and
- a second data output circuit configured to align the data transferred from the second global bus in series for outputting the aligned data to the second data pad.

10. The semiconductor memory device of claim 9, wherein the first data input circuit, the second data input circuit, the first write driver unit and the second write driver unit are operated in a write operation of the semiconductor memory device; and the first sense amplifier unit, the second sense amplifier unit, the first data output circuit and the second data output circuit are operated in a read operation of the semiconductor memory device.

11. The semiconductor memory device of claim 9, wherein the first data input circuit is configured to transfer the data aligned by the first data input circuit to the second global bus after inverting the aligned data.

12. The semiconductor memory device of claim 9, wherein the second data pad is not connected to test equipment in the test mode.

13. The semiconductor memory device of claim 9, further comprising a pulse generating unit configured to generate an internal read pulse activated twice by applying one read command in the test mode.

14. The semiconductor memory device of claim 13, wherein the first sense amplifier unit alternately loads the data of the first local bus and the data of the second local bus on the first global bus every time that the internal read pulse is activated in the test mode.

* * * * *